United States Patent
Caracciolo

(10) Patent No.: US 6,772,025 B1
(45) Date of Patent: Aug. 3, 2004

(54) DEVICE "ID" ENCODING WITH USE OF PROTECTION DEVICES

(75) Inventor: Lawrence Caracciolo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 09/676,300

(22) Filed: Sep. 28, 2000

(51) Int. Cl.⁷ .............................................. G06F 19/00
(52) U.S. Cl. ........................................................ 700/95
(58) Field of Search ........................... 700/90, 95, 121, 700/117; 716/11, 4, 8, 17

(56) References Cited

U.S. PATENT DOCUMENTS

| | | | | |
|---|---|---|---|---|
| 4,150,331 A | * | 4/1979 | Lacher .......................... 324/133 |
| 4,924,175 A | * | 5/1990 | Clinton ....................... 324/73.1 |
| 5,510,947 A | * | 4/1996 | Pellegrini et al. ............. 361/56 |
| 6,154,082 A | * | 11/2000 | Bernard et al. .............. 327/310 |
| 6,161,213 A | * | 12/2000 | Lofstrom ......................... 716/4 |
| 6,211,575 B1 | * | 4/2001 | Hansford ....................... 257/786 |
| 6,297,993 B1 | * | 10/2001 | Chen et al. ............. 365/185.33 |
| 6,411,480 B1 | * | 6/2002 | Gauthier et al. .............. 361/56 |
| 6,490,646 B1 | * | 12/2002 | Leydier ....................... 710/301 |

* cited by examiner

*Primary Examiner*—Leo Picard
*Assistant Examiner*—Chad Rapp
(74) *Attorney, Agent, or Firm*—Blakely, Sokoloff, Taylor & Zafman LLP

(57) ABSTRACT

An apparatus including an integrated circuit device comprising a plurality of pins, a plurality of electrostatic discharge units individually coupled to respective ones of the plurality of pins, and a portion of the plurality of electrostatic discharge units configured, upon addressing, to generate a signal representing a signature of the integrated circuit device. A method including for a plurality of suppliers of a similar integrated circuit device, the integrated circuit device comprising a plurality of pins and a plurality of electrostatic discharge units individually coupled to respective ones of a portion of the plurality of pins, and assigning an output value representative of the supplier to an addressing of the plurality of electrostatic discharge units.

14 Claims, 2 Drawing Sheets

DEVICE "ID" ENCODING WITH USE OF PROTECTION DEVICES

BACKGROUND OF THE INVENTION

1. Field of the Invention

The invention relates to integrated circuit testing.

2. Background

In the assembly of component parts (devices) from various suppliers in a package, such as a motherboard of a processor, such parts are generally inventoried, subjected to a quality assurance analysis for fitness, staged in readiness, and assembled into the package. The package is then tested for fitness, both through visual inspections and circuit testing. The visual inspection may involved, for example, a visual confirmation that the correct part is located in the correct place. The circuit testing generally device values (e.g., through current, resistance, capacitance, etc.) component orientation, and circuit content. It is appreciated that in the assembly of a package, it is desirous that the correct and capable part is installed in the package.

Many component parts of a scale of less than four microns ($\mu$m) include an I²C bus and associated registers. The I²C bus was developed by Philips Semiconductor of Sunnyvale, California. The electrical fitness of a part (device) with an associated I²C bus and register may be evaluated through such circuitry.

Generally larger (about 4 $\mu$m or greater) legacy technology necessary, for example, for handling high power conversion applications typically do not contain I²C bus technology and the increase pin count associated with such technology is not cost effective to incorporate. Accordingly, what is needed is an alternative for electrically verifying the fitness of a component part (device) that is compatible with larger scale components.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

In general, most component parts designed for assembly on a package such as a printed circuit board including a motherboard of a processor incorporate a coupling technology to electrically couple the part (IC) to the package. Typically, particularly with larger technologies (on the order of 4 $\mu$m or more) such coupling technology includes an array of pins. Such pins include power and ground pins as well as pins to carry electrical information (signals) to and from the part (IC).

To protect the devices of a part (IC) from errant electrical signals, particularly triboelectricity in the form of electrostatic discharge (ESD), manufactures generally include on the pins of the part (IC) a protection device such as an ESD device. An ESD device coupled to ground is designed to act in the presence of a high voltage event at the pin to bring the associated current to ground rather than exposing such event to the part (IC). The typical ESD device is the diode, including a diode connected transistor (e.g., NPN transistor), with one diode from device ground to the device pin.

Figure 1:
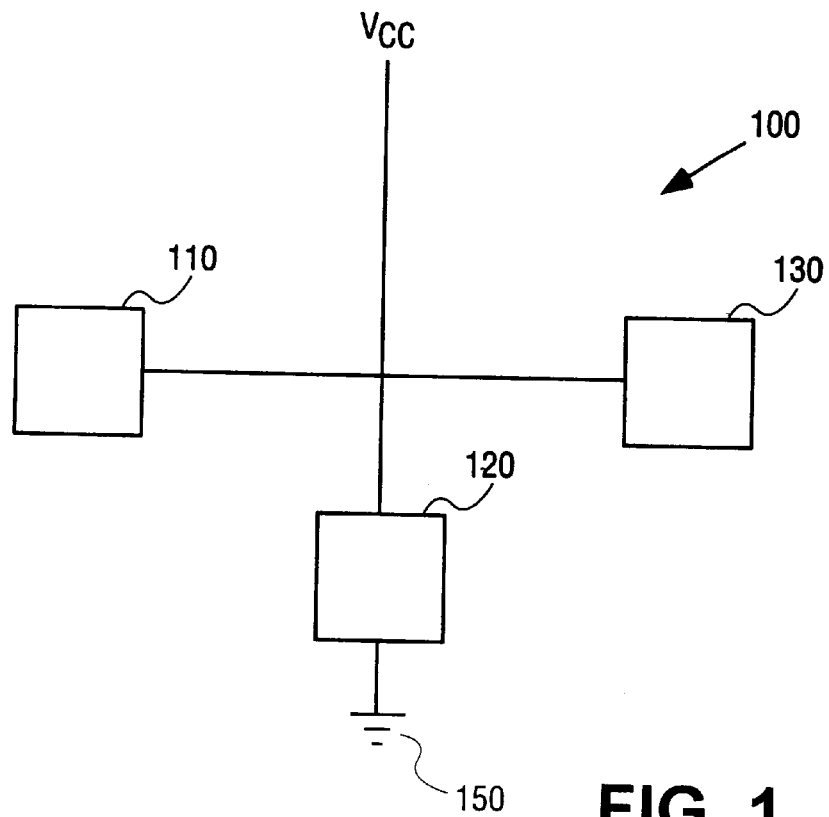
FIG. 1 shows a schematic representation of an ESD device protection system on a part (device).

FIG. 1 shows a typical configuration of a part (IC) with an ESD device. Assembly 100 includes part (IC) 130 having pin 110 (typically a plurality of pins) for coupling part (IC) 130 to a package. Between part (device) 130 and pin 110 is ESD device 120. With this configuration, a high voltage event at pin 110 will get diverted from part (device) 130 to ESD device 120 and to ground.

According to one embodiment, an ESD device or devices of a part (IC) such as an integrated circuit chip on a package, including a motherboard are utilized as a representation of the type of part (IC) and/or the supplier of the part (IC). In one example, a signal generated by an ESD device or devices upon addressing represents a signature of the part (IC) such as the type of part (IC) or the manufacturer or supplier of the part (IC).

In another embodiment, a method of identifying an integrated circuit part (IC) is disclosed. The identification includes addressing an ESD device or devices on the part (IC), generating an output signal from the ESD device or devices, and identifying the part (IC) by the output signal.

Figure 2:
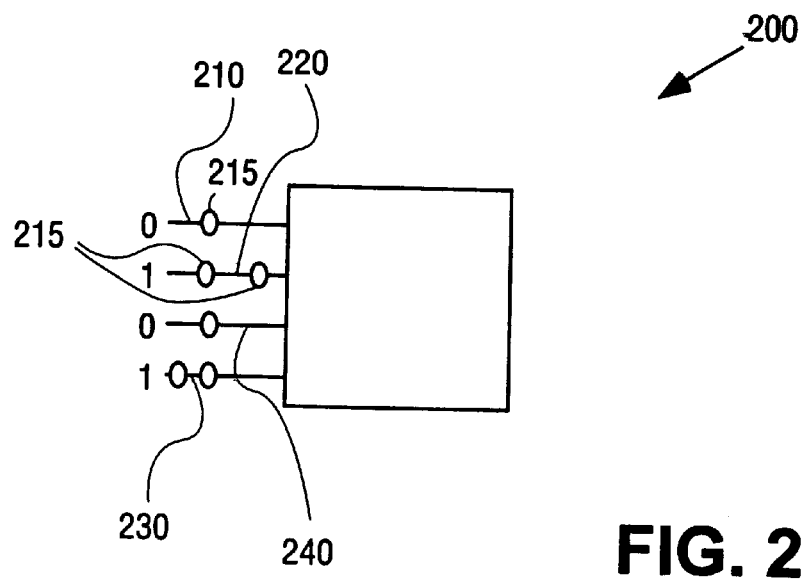
FIG. 2 shows a schematic representation of a part (device) having external pins suitable for mounting on a package and an assigned signature according to an embodiment of the invention.

FIG. 2 is a schematic illustration of a part (IC) configured with an electrical signature according to an embodiment of the invention. FIG. 2 shows part (IC) 200 such as an integrated circuit chip suitable for placement on a package such as a printed circuit board (e.g., a motherboard). In one embodiment, part (IC) 200 has a footprint on the order of 4 $\mu$m or greater. Examples include, but are not limited to, typical power conversion units such as field effect transistor (FET) drivers, FET controllers, and low drop out (LDO) voltage regulators. Part 200 may have several pins that are configured to communicate with a printed circuit board. FIG. 2 illustrates four representative pins 210, 220, 230, and 240. Each of the four pins has or is associated with part (device) 200 by at least one ESD device 215. ESD device 215 may be, for example, a diode, including but not limited to, a diode-connected NPN transistor.

FIG. 2 shows a pin array (four pins) with an alternating number of ESD devices (e.g., diodes) on each of the pins of the array. Pin 210 has a single ESD device (ESD device 215). Pin 220 has two ESD devices. Pin 230 has a single ESD device. Pin 240 has two ESD devices.

In one example, part (IC) 200 is an FET driver available from more than one manufacturer. It may be desirable, in the context of evaluating part (IC) 200, such as during ICT, to identify that part (IC) 200 is an FET driver and/or the manufacturer of part (IC) 200. By requiring that manufacturers of FET drivers conform to a predetermined or assigned ESD device configuration associated with a selected number of pins, part (IC) 200 can be evaluated for fitness. Thus, electrically addressing the selected number of pins (pins 210, 220, 230, and 240) by, in the case of a diode, forcing a current from ground to pin, an electrical signature may be measured identifying the part (IC) as an FET driver and/or the manufacturer of the part (IC). In one embodiment, a pseudo binary value may be assigned to an electrical output. For example, where the ESD devices are diodes, a signal output of, for example, 0.7 volts represents a single diode and is assigned a binary value of "0". A signal output of 1.4 volts represents two diodes and is assigned a binary value of "1". Thus, depending on the number of pins representing a signature, a binary representation of part (IC) 200 can be established.

It is to be appreciated that any number of ESD devices may be used for a desired signature. For example, where the objective is to electrically identify one of two manufacturers of a part (IC), a single ESD device such as ESD device 210, the two manufacturers may be individually identified by whether the output of ESD device 210 is represented as a "0" or a "1".

Figure 3:
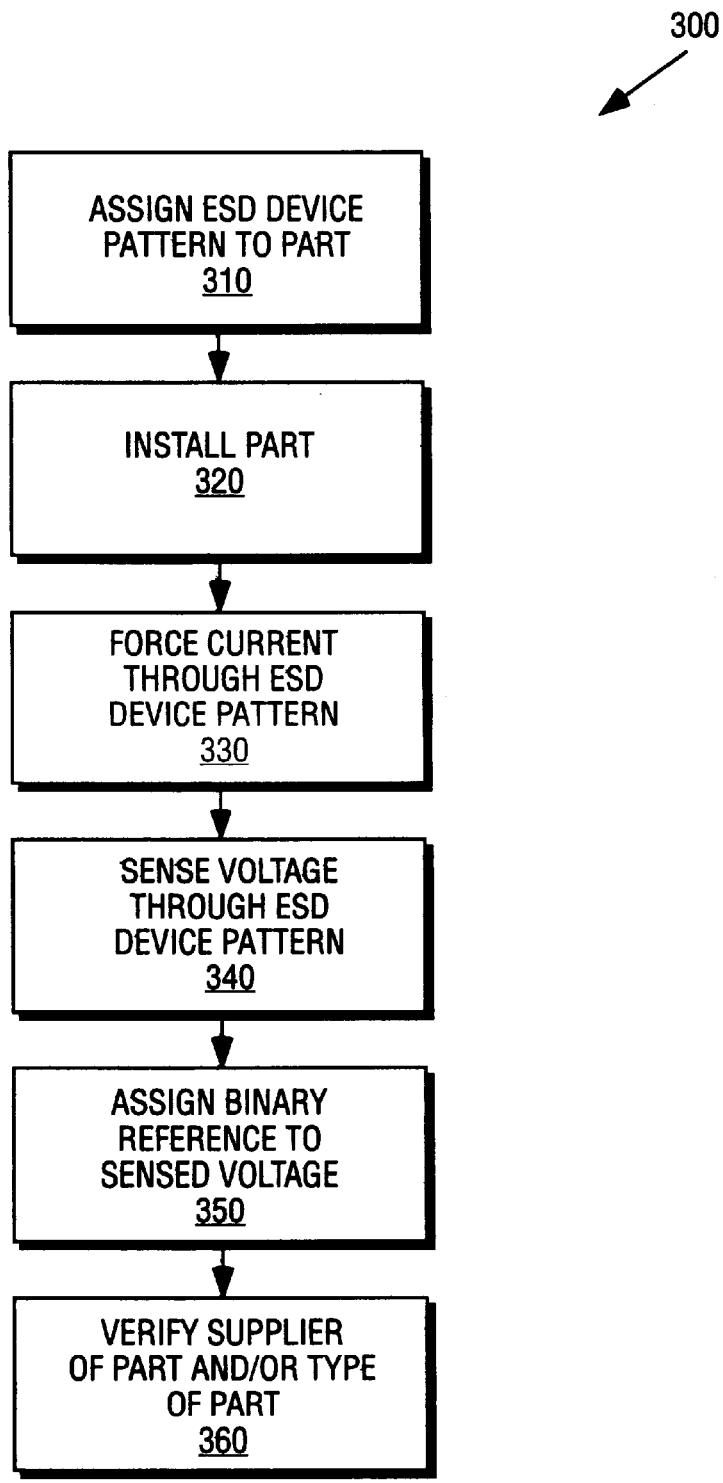
FIG. 3 shows a process flow of establishing and identifying a signature of a party (device) in accordance with an embodiment of the invention.

FIG. 3 is representation of a process flow of carrying out an identification of a part (IC). FIG. 3 presents a process flow to electrically address and identify a part (IC) on a package utilizing ESD devices, such as ESD diodes, coupled to pins of a part (IC). Process flow 300 begins by assigning an ESD device pattern to a predetermined number of pin-coupled ESD devices (block 310). In the case of a manufacturer or manufacturers of a single part (IC), the assignment may involve an assignment representative of the type of part (IC) and/or the manufacturer.

Once the ESD device pattern is assigned, the part (IC) is installed on the package such as on a printed circuit board, including but not limited to a motherboard (block 320). As part of, for example, ICT testing, the part (IC) is electrically evaluated for a signature. In the case of an ESD diode or diodes coupled to external pins of the part (IC), this is achieved by forcing a current through the assigned ESD devices (block 330). The corresponding voltage (e.g., forward conduction voltage) is sensed (e.g., measured) (block 340) and a pseudo-binary value is assigned to each output (block 350). Based on the pseudo-binary value measured, an electrical signature of the part (IC) is provided. Such a signature may be used to, among other things, verify the supplier of the part (IC) and/or verify that the correct part (IC) is placed on the package (block 360).

The placing of an identifier within an ESD device allows the ESD device configuration to be used as a signature of a part (IC). By electrically addressing and identifying a signature, the possibility of placing the incorrect part (IC) (either type or manufacturer) on a package may be reduced. Thus, the technique may be used to enhance wrong-part detection by electronic methods.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus comprising:
   an integrated circuit device comprising a plurality of pins;
   a plurality of electrostatic discharge units individually coupled to respective ones of the plurality of pins; and
   a portion of the plurality of electrostatic discharge units configured, upon addressing, to generate a signal representing a signature of the integrated circuit device, wherein the signature comprises generating a binary code identifying a supplier of the integrated circuit device.

2. The apparatus of claim 1, wherein the portion of the plurality of electrostatic discharge units each comprise at least one diode, and the signal represents the forward conduction voltage of the at least one diode.

3. The apparatus of claim 2, wherein a variation in the number of diodes between the portion of the plurality of electrostatic discharge units determines the signature of the integrated circuit device.

4. The apparatus of claim 3, wherein each of the portion of the plurality of electrostatic discharge units comprises one of one and two diodes, and the electrostatic discharge units comprising two diodes have such diodes arranged in series.

5. The apparatus of claim 3, wherein the plurality of pins of the integrated circuit device have a footprint of at least 4 microns.

6. A method comprising:
   addressing a portion of a plurality of electrostatic discharge units coupled to respective ones of a plurality of pins on an integrated circuit device;
   generating an output signal from the plurality of electrostatic discharge units; and
   identifying the integrated circuit device by the output signal,
   wherein identifying the integrated circuit device comprises generating a binary code identifying a supplier of the integrated circuit device.

7. The method of claim 6, wherein the plurality of electrostatic discharge units each comprise at least one diode, and generating an output signal comprises generating a signal representing the forward conduction voltage of the at least one diode.

8. The method of claim 7, wherein a first portion of the plurality electrostatic discharge units comprise one diode and a second portion of the plurality electrostatic discharge units comprise two diodes in series, the method further comprising:
   assigning a first binary value to the output signal from the first portion of the plurality of electrostatic discharge units and assigning a second binary value to the output signal of the second portion of the plurality of electrostatic discharge units.

9. The method of claim 8, further comprising, for a plurality of suppliers of the integrated circuit device, assigning a binary code to each integrated circuit device representative of the supplier.

10. A method comprising:
    for a plurality of suppliers of a similar integrated circuit device, the integrated circuit device comprising a plurality of pins and a plurality of electrostatic discharge units individually coupled to respective ones of a portion of the plurality of pins;
    assigning an output value representative of the supplier to an addressing of the plurality of electrostatic discharge units.

11. The method of claim 10, wherein the plurality of electrostatic discharge units each comprise at least one diode, and the output value to an addressing comprises a signal representative of the forward conduction voltage of the at least one diode.

12. The method of claim 11, wherein a first portion of the plurality of electrostatic discharge units comprise one diode and a second portion of the plurality of electrostatic discharge units comprise two diodes in series, wherein assigning an output value comprises assigning a first binary value to the output signal from the first portion of the plurality of electrostatic discharge units and assigning a second binary value to the output signal of the second portion of the plurality of electrostatic discharge units.

13. The method of claim 12, wherein the output value comprises a binary code.

14. The method of claim 13, further comprising identifying the supplier by the output value.

* * * * *

UNITED STATES PATENT AND TRADEMARK OFFICE
CERTIFICATE OF CORRECTION

PATENT NO. : 6,772,025 B1
DATED : August 3, 2004
INVENTOR(S) : Caracciolo

It is certified that error appears in the above-identified patent and that said Letters Patent is hereby corrected as shown below:

Column 1,
Line 18, after "generally", insert -- involves some level of parametric testing, such as verifying --.

Signed and Sealed this

Nineteenth Day of October, 2004

JON W. DUDAS
*Director of the United States Patent and Trademark Office*